US009552881B2

(12) United States Patent
Iwamoto et al.

(10) Patent No.: US 9,552,881 B2
(45) Date of Patent: Jan. 24, 2017

(54) SEARCH SYSTEM COMPRISING FIRST AND SECOND SEARCH UNITS WITH DIFFERENT SEARCH SCHEMES THAT RESPECTIVELY USE SPECIFIC AND NON-SPECIFIC BIT STRINGS OF SEARCH KEY

(71) Applicant: RENESAS ELECTRONICS CORPORATION, Kawasaki-shi, Kanagawa (JP)

(72) Inventors: Hisashi Iwamoto, Kawasaki (JP); Koji Yamamoto, Yokohama (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 525 days.

(21) Appl. No.: 14/085,596

(22) Filed: Nov. 20, 2013

(65) Prior Publication Data
US 2014/0160825 A1    Jun. 12, 2014

(30) Foreign Application Priority Data

Nov. 21, 2012  (JP) .................................. 2012-254983
Apr. 25, 2013  (JP) .................................. 2013-092374

(51) Int. Cl.
*G06F 12/00*       (2006.01)
*G11C 15/04*       (2006.01)
*H04L 12/743*      (2013.01)
*G06F 17/30*       (2006.01)
*G06F 1/32*        (2006.01)
*G11C 15/00*       (2006.01)

(52) U.S. Cl.
CPC ......... *G11C 15/04* (2013.01); *G06F 17/30982* (2013.01); *H04L 45/7457* (2013.01); *G06F 1/3275* (2013.01); *G11C 15/00* (2013.01)

(58) Field of Classification Search
CPC .... G11C 15/04; G11C 15/00; G06F 17/30982; G06F 1/3275; G06F 3/0625; H04L 45/00; H04L 45/7453; H04L 45/7457
USPC ...................... 711/108; 713/320; 365/189.07
See application file for complete search history.

(56) References Cited

U.S. PATENT DOCUMENTS

| | | | | |
|---|---|---|---|---|
| 2003/0189932 | A1* | 10/2003 | Ishikawa ................. | H04L 47/10 370/392 |
| 2004/0032775 | A1* | 2/2004 | Srinivasan ............. | G11C 15/00 365/202 |
| 2005/0281257 | A1* | 12/2005 | Yazaki .................... | H04L 45/00 370/389 |

(Continued)

FOREIGN PATENT DOCUMENTS

| | | |
|---|---|---|
| JP | 06-261078 A | 9/1994 |
| JP | 08-023347 A | 1/1996 |

(Continued)

OTHER PUBLICATIONS

Notice of Grounds of Rejection Japanese Patent Application No. 2013-092374 dated Nov. 22, 2016 with English translation.

*Primary Examiner* — Hong Kim
(74) *Attorney, Agent, or Firm* — McDermott Will & Emery LLP

(57) ABSTRACT

A search system is obtained by combining a TCAM and a search engine not using the TCAM. The search engine not using the TCAM is constructed using a general-purpose memory cell structure, and includes a different-sized memory spaces each corresponding to an effective bit length of search target data.

13 Claims, 13 Drawing Sheets

(56) References Cited

U.S. PATENT DOCUMENTS

| | | | | |
|---|---|---|---|---|
| 2006/0152956 A1* | 7/2006 | Roth | ................... | G11C 15/04 |
| | | | | 365/49.17 |
| 2006/0167843 A1* | 7/2006 | Allwright | ......... | G06F 17/30952 |
| 2009/0316461 A1* | 12/2009 | Roth | ................... | G11C 15/04 |
| | | | | 365/49.1 |
| 2013/0246698 A1* | 9/2013 | Estan | ................... | G11C 7/1072 |
| | | | | 711/108 |
| 2014/0218994 A1* | 8/2014 | Argyres | ................... | G11C 5/14 |
| | | | | 365/49.17 |
| 2015/0006808 A1* | 1/2015 | Miller | ................... | G11C 15/00 |
| | | | | 711/108 |

FOREIGN PATENT DOCUMENTS

| | | |
|---|---|---|
| JP | 2003-143198 A | 5/2003 |
| JP | 2006-005636 A | 1/2006 |
| JP | 2013-038536 A | 2/2013 |

\* cited by examiner

FIG.7

SEARCH SYSTEM COMPRISING FIRST AND SECOND SEARCH UNITS WITH DIFFERENT SEARCH SCHEMES THAT RESPECTIVELY USE SPECIFIC AND NON-SPECIFIC BIT STRINGS OF SEARCH KEY

BACKGROUND OF THE INVENTION

Field of the Invention

The present invention relates to a search system searching for a data word matching an input search key by a longest prefix match search, which is for example suitably used in a router of a packet-switched network.

Description of the Background Art

By a router provided in a network such as the Internet where a TCP/IP (Transmission Control Protocol/Internet Protocol) is used, forwarding, i.e. transferring a packet received from another host to another path, is performed. Each router stores a search table (a forwarding table) that defines the relation between an IP address and a path to a forwarding destination. The packet transfer path is determined in accordance with this search table. Specifically, a destination IP address included in the received packet is set as a search key and a next-hop IP address matching this search key is searched within the search table by a longest prefix match search.

In order to perform forwarding at a high speed, it is necessary to accelerate a search for the next-hop IP address within the search table. A content addressable memory (CAM) is often used as dedicated hardware for this purpose.

Japanese Patent Laying-Open No. 2006-5636 discloses an example in which a search table is configured using a TCAM (Ternary CAM). Specifically, the TCAM in this document includes a first CAM entry for setting higher-order bits of an IP address and a second CAM entry for setting lower-order bits of the IP address. The higher-order bits of the destination address of the received packet are compared with the first CAM entry, and then, the lower-order bits of the destination address of the received packet are compared with the second CAM entry.

Japanese Patent Laying-Open No. 2003-143198 discloses an example of a search table for which a TCAM is not used. Specifically, each bit of the transferred IP address is compared to a corresponding bit of an IP address defined within a forwarding table sequentially from the highest-order bit. Particularly, this document proposes a method of referring to the IP address by a plurality of bits in order to shorten the time required for forwarding.

According to the search method using a TCAM as disclosed in the above-mentioned Japanese Patent Laying-Open No. 2006-5636, the number of times of comparison between the search key and the search table can be decreased, but there is a disadvantage that power consumption is increased since a TCAM device is used. On the other hand, according to the search method not using a TCAM as disclosed in the above-mentioned Japanese Patent Laying-Open No. 2003-143198, comparison between the search key and the search table can be conducted with extremely little power consumption, but there is also a disadvantage that forwarding becomes time-consuming due to the increased number of times of search.

SUMMARY OF THE INVENTION

The inventors of the present application invented a new search system not using a TCAM, which overcomes the disadvantages of each search method as described above (see Japanese Patent Laying-Open No. 2013-38536). This search system however poses a problem that a memory capacity increases exponentially in accordance with an increase in the bit length of the search key.

The search system according to one embodiment is obtained by combining a TCAM and the above-mentioned new search engine that does not use a TCAM. Preferably, the search engine not using a TCAM is constructed using a general-purpose memory-cell structure, and includes different-sized memory spaces each corresponding to an effective bit length of search target data.

According to one embodiment described above, it becomes possible to provide a search system having a relatively small memory capacity and operated at a high speed and with low power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram for illustrating allocation of data in the search system in FIG. 5.

DESCRIPTION OF THE PREFERRED EMBODIMENTS

In the following, a description will be first given about configurations of a TCAM and a search engine not using the TCAM (which will be hereinafter referred to as a "power-saving search engine"). Then, each embodiment will be described. The TCAM and the power-saving search engine are utilized in each embodiment. In the following descrip- <As to TCAM>
[Schematic Configuration of TCAM]

Figure 1:
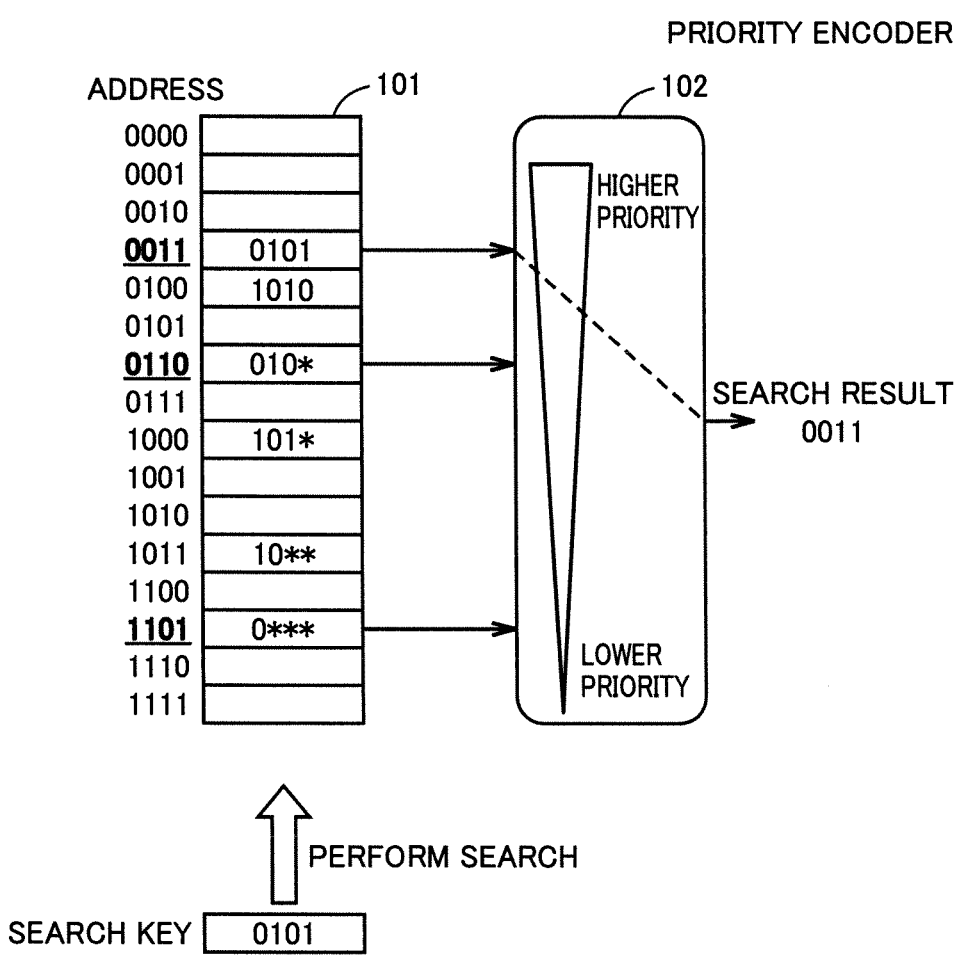
FIG. 1 is a block diagram schematically showing the configuration of a TCAM.

FIG. 1 is a block diagram schematically showing the configuration of a TCAM. A TCAM 100 includes a memory cell array 101 and a priority encoder 102. For ease of explanation, FIG. 1 shows the case where a search key is 4 bits and a 4-bit address is allocated to a memory cell array (that is, the number of storable data is 16).

FIG. 1 illustrates the state where six pieces of search target data is stored in a memory cell array of TCAM 100 forming a search table. In this case, "*" indicates a don't care bit, and the number of bits excluding "*" indicates an effective bit length. Specifically, the effective bit length of each of data [0101] and [1010] is 4; the effective bit length of each of data [010*] and [101*] is 3; the effective bit length of data [10] is 2; and the effective bit length of data [0*] is 1. Each of one or more bits continuous from the least significant bit of each search target data can be set as a don't care bit.

Due to existence of such a don't care bit, a plurality of pieces of data may match one search key. Then, a longest prefix match search is used. The longest prefix match search is a search method for determining that the data having a longer effective bit length is the data most matched to the search key.

The search operation is started by input of a search key [0101]. TCAM 100 collectively checks entire memory cell array 101 that is a search table, and notifies priority encoder 102 about the address information corresponding to every search target data that matches search key [0101]. In FIG. 1, it is determined that each of three pieces of data [0101], [010*] and [0***] matches search key [0101], and priority encoder 102 is notified of address information [0011], [0110] and [1101] corresponding to these three pieces of data, respectively.

Priority encoder 102 outputs an address [0011] corresponding to data [0101] of the highest priority, that is, having the longest effective bit length. In fact, priority encoder 102 can obtain address information of the data matching the search key as described above, but there is no way to know the effective bit length of the data corresponding to each address information. Thus, when the search target data is stored in TCAM 100 in advance, the data is set such that the longer the effective bit length is, the lower the number of the address is. Priority encoder 102 preferentially outputs the address having a lower number. In FIG. 1, TCAM 100 outputs address [0011] as a search result, and ends the search operation. As a result, a code [0011] indicating a prescribed process linked to a search key [0101] is acquired.

[Configuration of Memory Cell]

Figure 2:
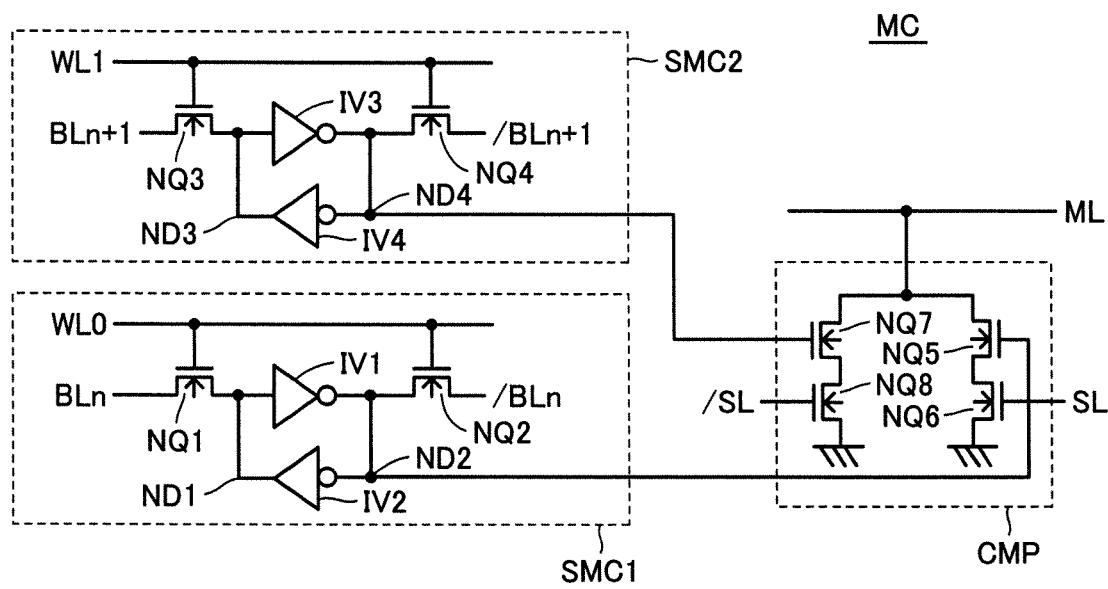
FIG. 2 is a circuit diagram showing an example of a memory cell of the TCAM.

FIG. 2 is a circuit diagram showing an example of a memory cell of the TCAM. Referring to FIG. 2, a TCAM cell MC includes two sub memory cells SMC1 and SMC2 each formed by an SRAM (Static Random Access Memory); and a comparison unit CMP comparing the bit data stored in these sub memory cells SMC 1 and SMC2 with the search bit data.

Sub memory cell SMC1 includes inverters IV1 and IV2 forming an inverter latch; and N-channel MOS transistors NQ1 and NQ2 coupling an input node and an output node of inverter IV1 with bit lines BLn and /BLn, respectively, in accordance with a signal on a word line WL0. MOS transistors NQ1 and NQ2 each have a gate connected to word line WL0. Mutual complementary data bits are stored in memory nodes ND1 and ND2.

Similarly, sub memory cell SMC2 includes inverters IV3 and IV4 forming an inverter latch; and N-channel MOS transistors NQ3 and NQ4 coupling an input node and an output node of inverter IV3 with bit lines BLn+1 and /BLn+1, respectively, in accordance with a signal on a word line WL1. MOS transistors NQ3 and NQ4 each have a gate connected to word line WL1. Mutual complementary data bits are stored in memory nodes ND3 and ND4.

Comparison unit CMP includes N-channel MOS transistors NQ5 and NQ6 connected in series between a match line ML and a ground node; and N-channel MOS transistors NQ7 and NQ8 connected in series between match line ML and the ground node. MOS transistor NQ5 has a gate coupled to an output node ND2 of inverter IV1 (an input node of inverter IV2) provided in sub memory cell SMC1 while MOS transistor NQ6 has a gate coupled to a search line SL. MOS transistor NQ7 has a gate coupled to an output node ND4 of inverter IV3 (an input node of inverter IV4) provided in sub memory cell SMC2 while MOS transistor NQ8 has a gate coupled to an complementary search line /SL.

When bit data "1" is stored in each of memory nodes ND1 and ND3 of sub memory cells SMC1 and SMC2, respectively, MOS transistors NQ5 and NQ7 each are in an always-OFF state in comparison unit CMP. Accordingly, irrespective of the logical value of the search bit data transmitted through search lines SL and /SL, match line ML is maintained at a precharge potential level. Specifically, in this case, CAM cell MC exhibits an always-matched state (don't care state).

When bit data "0" is stored in each of memory nodes ND1 and ND3 of sub memory cells SMC1 and SMC2, respectively, MOS transistors NQ5 and NQ7 each are in an always-ON state in comparison unit CMP. In this case, irrespective of the logical value of the search bit data transmitted through search lines SL and /SL, one of the path of MOS transistors NQ5 and NQ6 and the path of MOS transistors NQ7 and NQ8 is brought into conduction, and thus, match line ML is discharged. Accordingly, in this case, the TCAM cell exhibits an always-unmatched state (normally, the always-unmatched state is not employed).

When bit data "1" and bit data "0" are stored respectively in memory nodes ND1 and ND3 of sub memory cells SMC1 and SMC2, MOS transistor NQ5 is brought into an always-OFF state while MOS transistor NQ7 is brought into an always-ON state. Accordingly, when the search bit data is "0", that is, when the data of an H-level potential ("1") is transmitted to search line /SL, match line ML is discharged and the TCAM cell exhibits an unmatched state. On the other hand, when the search bit data is "1", that is, when the data of an L-level potential ("0") is transmitted to search line /SL, match line ML is maintained at a precharge potential, and the TCAM cell exhibits a matched state.

When bit data "0" and bit data "1" are stored respectively in memory nodes ND1 and ND3 of sub memory cells SMC1 and SMC2, MOS transistor NQ5 is brought into an always-ON state while MOS transistor NQ7 is brought into an always-OFF state. Accordingly, when the search bit data is "1", that is, when the data of an H-level potential ("1") is transmitted to search line SL, match line ML is discharged and the TCAM cell exhibits an unmatched state. On the other hand, when the search bit data is "0", that is, when the data of an L-level potential ("0") is transmitted to search line SL, match line ML is maintained at a precharge potential and the TCAM cell exhibits a matched state.

In the TCAM cell, a DRAM (Dynamic Random Access Memory) cell or a logic circuit may be used in place of an SRAM shown in FIG. 2.

[Detailed Configuration of TCAM]

Figure 3:
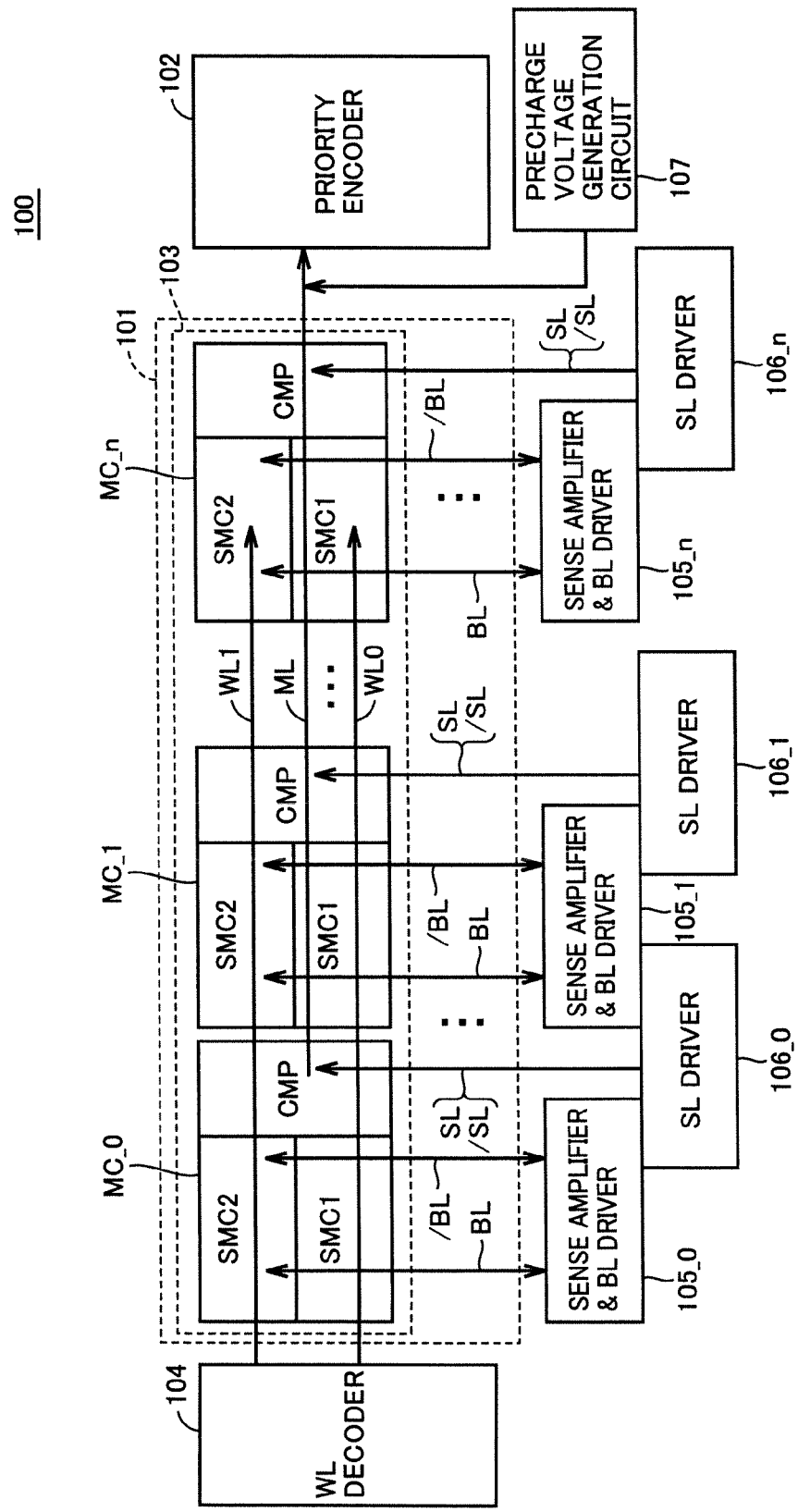
FIG. 3 is a block diagram showing a detailed configuration of the TCAM.

FIG. 3 is a block diagram showing the detailed configuration of the TCAM. Referring to FIGS. 2 and 3, TCAM 100 includes a memory cell array 101, a priority encoder 102, a word line decoder 104, sense amplifiers & bit line drivers 105_0 to 105_n, search line drivers 106_0 to 106_n, and a precharge voltage generation circuit 107. TCAM 100 further includes a word line pair WL0, WL1 and match line ML provided corresponding to each row of memory cell array 101; and a bit line pair BL, /BL and a search line pair SL, /SL provided corresponding to each column of memory cell array 101.

One data word is stored for n+1 memory cells MC_0 to MC_n (entry region 103) provided in each row of memory cell array 101. Accordingly, the number of data words that can be stored in TCAM 100 in FIG. 3 is equal to the number of rows in memory cell array 101.

When data is read from sub memory cell SMC1 or SMC2 or when data is written into sub memory cell SMC1 or SMC2, word line decoder 104 activates word line WL0 or WL1 corresponding to targeted sub memory cell SMC1 or SMC2.

When data is read from sub memory cell SMC1 or SMC2, sense amplifier 105 detects stored data through bit line pair BL, /BL corresponding to sub memory cell SMC1 or SMC2 from which data is to be read. When data is written into sub memory cell SMC1 or SMC2, bit line driver 105 supplies a voltage value in accordance with the written data to bit line pair BL, /BL corresponding to sub memory cell SMC1 or SMC2 into which data is written.

Each of search line drivers 106_0 to 106_n supplies a voltage corresponding to the logic level of each bit of the search key through search lines SL and SL/ during the data search. Match line ML is precharged by precharge voltage generation circuit 107 during the data search. On match line ML of the row in which a data word matching the search key is stored, the precharge potential is maintained as it is. On match line ML of the row in which the data word not matching the search key is stored, the precharge potential is discharged.

[Problems of TCAM]

As described above, the TCAM is implemented in a scheme in which specific memory cells are used for constructing a search table space and all of the specific memory cells are activated during a search in order to search for the data matching a search key. Accordingly, although the search speed is relatively high, there exists a problem that power consumption is extremely increased.

Furthermore, in order to perform a longest prefix match search, it is necessary to store the data having a longer effective bit length in an address having a lower number during creation of a search table. Thus, control of address allocation becomes complicated. Accordingly, when new search target data is stored, maintenance for re-creating a search table takes time.

Furthermore, since the area occupied by the TCAM cell is relatively large, the entire circuit area is also increased. Accordingly, the number of rows of the memory cell array in FIG. 3 is limited, and thus, the number of pieces of storable data (the number of entries) is limited.

<As to Power-Saving Search Engine>

[Configuration of Power-Saving Search Engine]

Figure 4:
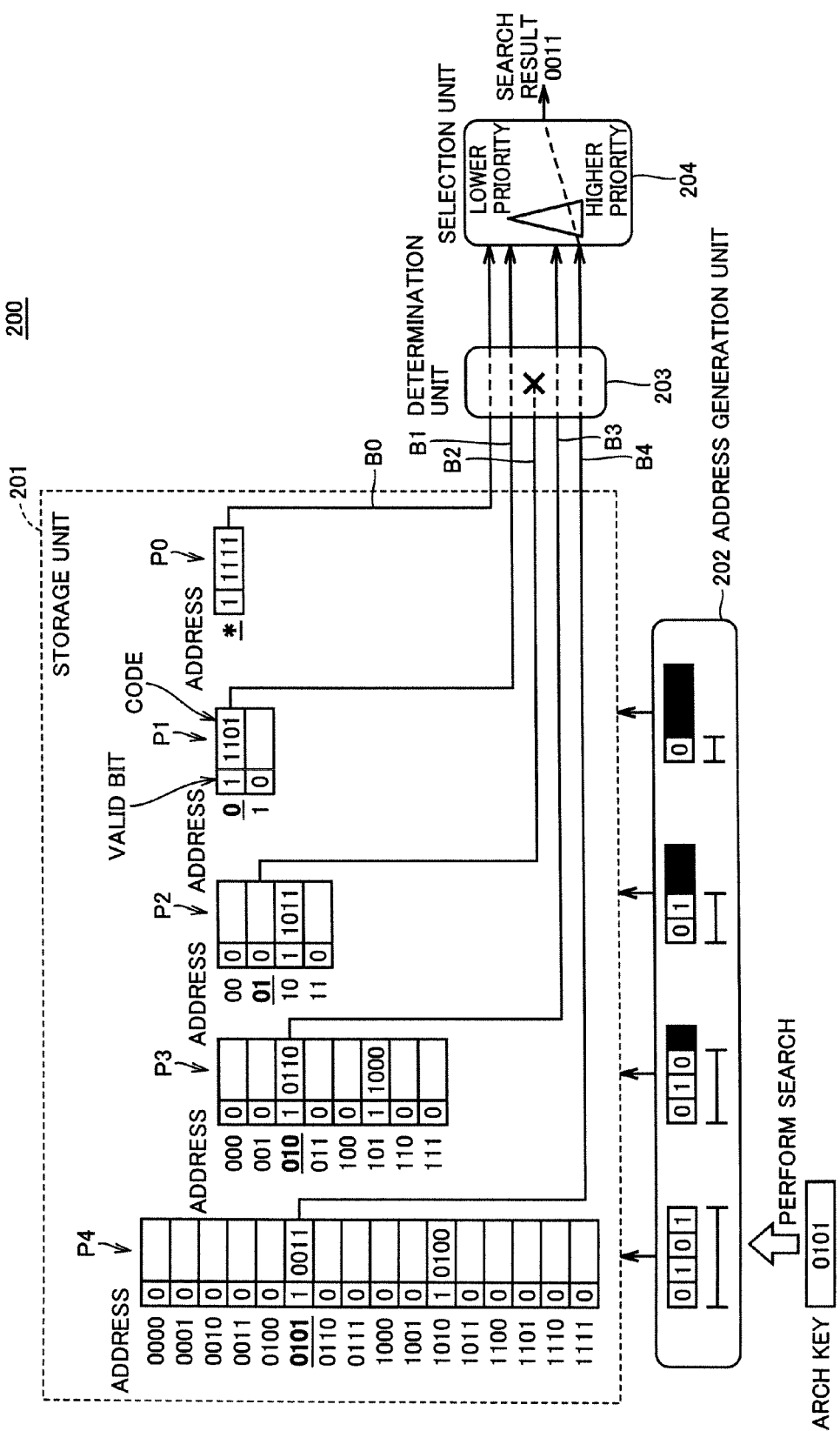
FIG. 4 is a block diagram schematically showing the configuration of a power-saving search engine.

FIG. 4 is a block diagram schematically showing the configuration of a power-saving search engine. FIG. 4 shows an example in which a search is performed using the input search key [0101] for six pieces of search target data [0101], [010*], [0***], [1010], [101*], and [10**], as in the case of the TCAM in FIG. 1. Also, the figure shows an example in which a code [0011] is output that corresponds to [0101] of the longest effective bit length among data [0101], [010*] and [0***] each matching a search key [0101]. Although a bit length M of the search key is set at 4 as in FIG. 1, a search key and search target data each having a longer bit length is actually used. The search operation is started by input of search key [0101].

Referring to FIG. 4, power-saving search engine 200 includes a storage unit 201, an address generation unit 202, a determination unit 203, and a selection unit 204. The configuration and the operation of each component will be hereinafter described.

1. Storage Unit

Storage unit 201 includes a plurality of memory spaces that are formed by general-purpose memories such as a DRAM and an SRAM, and are different in space size. The search table is constructed using these memory spaces. Usually, in accordance with a bit number M (M≥2) of the search key, M memory spaces are provided that are different in space size and have 1-bit to M-bit address lengths. In FIG. 4, on the condition that M=4, memory spaces P1 to P4 that can be identified by addresses having a 1-bit length to a 4-bit length are provided. Furthermore, a memory P0 (which will be hereinafter also referred to as a register P0) is provided for storing a code that is to be output when there is no search target data matching the search key. Although memory P0 is not allocated with an address, memory P0 may be referred to as a memory space P0 for convenience.

The search target data is classified into a plurality of groups based on each effective bit length. In the case of the example shown in FIG. 4, the first group is configured by data [0*] having an effective bit length of 1; the second group is configured by data [10] having an effective bit length of 2; the third group is configured by data [010*] and [101*] each having an effective bit length of 3; and the fourth group is configured by data [0101] and [1010] each having an effective bit length of 4.

A plurality of memory spaces P1 to P4 provided in storage unit 201 correspond to these plurality of groups, respectively. The effective bit length of the search target data belonging to each group is equal to the length of the address by which the corresponding memory space is identified. In each memory space, a prescribed code corresponding to each search target data is stored in the region identified when an effective bit portion (a portion excluding a don't care bit) of each search target data is set as an address. The prescribed code as described above corresponds to the information related to an output port in the case of a router provided in the network; and corresponds to the TCAM's address in the case of FIG. 1.

When specifically described, addresses [0011] and [0100] corresponding to search target data [0101] and [1010], respectively, in FIG. 1 are stored in the regions identified by addresses [0101] and [1010], respectively, within memory space P4 in FIG. 4. Addresses [0110] and [1000] corresponding to search target data [010*] and [101*], respectively, in FIG. 1 are stored in the regions identified by addresses [010] and [101], respectively, within memory space P3 in FIG. 4. Address [1011] corresponding to search target data [10] in FIG. 1 is stored in the region identified by address [10] within memory space P2 in FIG. 4. Address [1101] corresponding to search target data [0*] in FIG. 1 is stored in the region identified by address [0] within memory space P1 in FIG. 4. In other words, an effective bit portion (a portion excluding a don't care bit) among the search target data stored in the TCAM in FIG. 1 is used as an address in FIG. 4 while a TCAM's address in FIG. 1 is used as a prescribed code stored in the memory in FIG. 4.

Furthermore, as shown in FIG. 4, it is preferable to provide a valid bit for each region identified by each address in each memory space. Each valid bit is used for indicating a valid region storing a prescribed code or an invalid region not storing a prescribed code.

Specifically in the case of FIG. 4, in the regions identified by addresses [0101], and [0], data [0011], [0110] and [1101] are stored, respectively, and a valid bit "1" (indicating "valid") is stored. Similarly, in the regions identified by addresses [1010], [101] and [10], data [0100], [1000] and [1011] are stored, respectively, and valid bit "1" is stored. Data [1111] as well as valid bit "1" are stored in memory P0. Valid bit "0" (indicating "invalid") is stored in each of other regions.

2. Address Generation Unit

From the most significant bit side of the search key, address generation unit 202 extracts the data whose bit number is equal to the length of the address used for identifying each of M memory spaces, thereby generating M read addresses. M read addresses have 1-bit to M-bit lengths, respectively. Address generation unit 202 outputs the generated M read addresses to storage unit 201.

Specifically in FIG. 4, address generation unit 202 outputs higher 4 bits [0101] of search key [0101] to storage unit 201 as a read address of memory space P4, and outputs higher 3 bits [010] of the search key to storage unit 201 as a read address of memory space P3. Address generation unit 202 further outputs higher 2 bits [01] of the search key to storage unit 201 as a read address of memory space P2, and outputs higher 1 bit [0] of the search key to storage unit 201 as a read address of memory space P1.

Each read data read from memory spaces P1 to P4 is transmitted to determination unit 203 through data buses B1 to B4, respectively. Furthermore, the data stored in memory P0 is transmitted to determination unit 203 through data bus B0. By providing data buses B0 to B4 exclusively for memory spaces P0 to P4, respectively, the operations of reading data from the memory spaces can be performed independently and concurrently.

3. Determination Unit

Determination unit 203 determines whether each of M pieces of read data read from M memory spaces by M read addresses, respectively, is valid read data including a prescribed code. Specifically, determination unit 203 determines whether each read data is valid or not based on whether the valid bit included in each read data is valid ("1") or not.

Specifically in the case of FIG. 4, data [1/1111], [1/1101], [0/–], [1/0110], and [1/0011] are read from memory spaces P0 to P4, respectively. In this case, these pieces of read data are arranged in the order of the "valid bit/prescribed code". Since the valid bit included in the data read from memory space P2 is "0", determination unit 203 determines that this read data is invalid. Then, determination unit 203 outputs only data [1/1111], [1/1101], [1/0110], and [1/0011], which are determined as valid, to selection unit 204.

4. Selection Unit

Selection unit 204 selects the read data read from the memory space of the highest priority, that is, having the largest space size (having the largest address size) from among the read data that has been determined as valid by determination unit 203, and outputs the prescribed code included in the selected read data. In the case of FIG. 4, a code [0011] included in data [1/0011] read from memory space P4 is output as a search result by power-saving search engine 200.

Consequently, a code [0011] (search result) indicating the prescribed process linked to search key [0101] can be obtained, as in the case of FIG. 1.

In this case, memory P0 is lower in priority than other memory spaces P1 to P4. When determination unit 203 determines that each read data read from memory spaces P1 to P4 is invalid (when none of the stored data in storage unit 201 matches the search key), selection unit 204 outputs a code [1111] included in read data [1/1111] of memory P0 as a search result. This means that read data [1/1111] of memory P0 is read from the memory space of the highest priority among the read data that has been determined as valid.

[Features and Problems of Power-Saving Search Engine]

According to the power-saving search engine described above, an inexpensive search system can be constructed only by a general-purpose memory cell structure without having to use a special memory cell structure such as a TCAM. In this case, since the read address in each memory space is uniquely defined from the search key, only the region accessed by the read address is operating in storage unit 201. Accordingly, power consumption can be reduced as compared with the TCAM in which every search table space is checked to search for the search target data matching the search key.

Furthermore, high-speed search can be carried out by reading data from each memory space independently and concurrently through the data bus exclusively for each memory space.

When implementing the longest prefix match search, in the case of the conventional search using a TCAM or the linear search, the search table should be created such that the data stored in the address having a lower number has a longer effective bit length. Thus, address allocation becomes complicated. On the other hand, in the case of the power-saving search engine in FIG. 4, data only have to be allocated to different memory spaces in accordance with the effective bit length of the search target data, so that rewriting of the table can be facilitated. Also, the number of entries can be increased.

The problem of the power-saving search engine in FIG. 4 is that the bit length of the search key cannot be increased. This is because the size of the search table is increased, thereby exceeding the capacity of memories which can be mounted. The practical limit of the bit length of the search key is 23 bits.

For example, in the configuration in which 1 bit is allocated to the valid bit and 4 bits are allocated to the search table as shown in FIG. 4, the memory capacity in the case where the search key is 4 bits is as follows:

$$5\times(2^1+2^2+2^3+2^4)=150$$

(wherein x^y indicates the y-th power of x). When the search key is increased by 1 bit so as to be 5 bits, the memory capacity is increased as follows:

$$5\times(2^1+2^2+2^3+2^4+2^5)=310$$

In other words, when the bit length of the search key is increased, the memory capacity is increased exponentially. Conversely, when the bit length of the search key is relatively short, the power-saving search engine is extremely effective.

In each of the embodiments described below, a small-capacity TCAM and a power-saving search engine are combined, thereby suppressing an increase in the memory capacity when the bit length of the search key is increased.

First Embodiment

Figure 5:
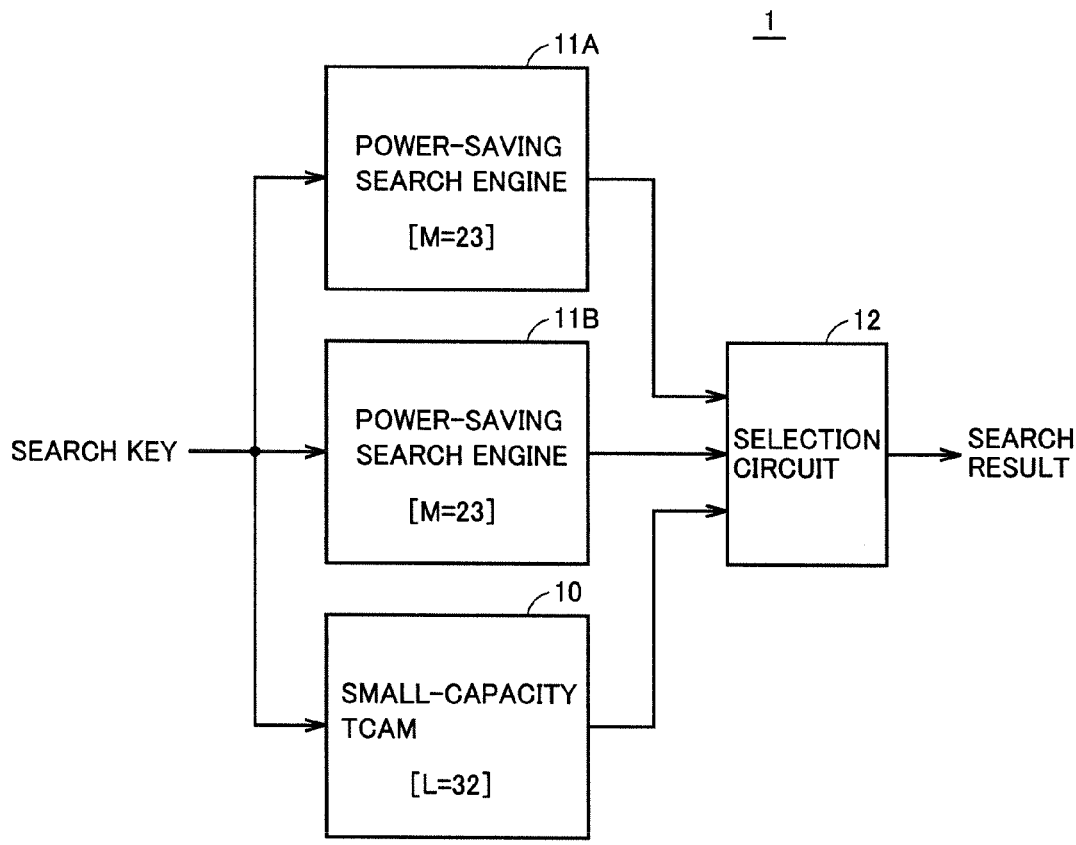
FIG. 5 is a block diagram showing the configuration of a search system according to the first embodiment.

FIG. 5 is a block diagram showing the configuration of a search system according to the first embodiment. In FIG. 5, assuming the case designed for searching for an IP address for IPv4 (Internet Protocol Version 4), a bit number L of the search key is set at 32 bits.

Referring to FIG. 5, a search system 1 can record a plurality of data words each having a bit length L (L=32), and searches for the data word matching the search key having a bit length L. In this case, each of one or more bits continuous from the least significant bit of each data word can be set as a don't care bit.

Specifically, search system 1 includes a plurality of (two) power-saving search engines (first search units) 11A and 11B capable of storing data of a bit length M (M=23); a small-capacity TCAM (second search unit) 10 capable of storing data of a bit length L (L=32); and a selection circuit 12.

Power-saving search engine 11A is used for recording data words each having a most significant bit of "0" and an effective bit length of 24 bits or less while power-saving search engine 11B is used for recording data words each having a most significant bit of "1" and an effective bit length of 24 bits or less. On the other hand, small-capacity TCAM 10 is used for recording data words each having an effective bit length of 25 bits or more.

In other words, power-saving search engines 11A and 11B each store a part of the data word excluding N (N=9) specific bits from the data word. Specifically, among data words each having an effective bit length of 24 bits or less, power-saving search engines 11A and 11B each store a bit string of 23 bits excluding the most significant bit and 8 bits from the least significant bit as specific bits.

Power-saving search engine 11A is configured to output a normal search result when the most significant bit of the input search key is "0", and to output the result indicating that there is no matching data when the most significant bit of the input search key is "1". Power-saving search engine 11B is configured to output a normal search result when the most significant bit of the input search key is "1", and to output the result indicating that there is no matching data when the most significant bit of the input search key is "0".

Based on the search results from power-saving search engines 11A, 11B and small-capacity TCAM 10, selection circuit 12 outputs one of these search results. Specifically, when the stored data matching the search key is found in small-capacity TCAM 10, selection circuit 12 outputs the address corresponding to this stored data. When the stored data matching the search key is not found in small-capacity TCAM 10, selection circuit 12 outputs the search results from one of power-saving search engines 11A and 11B indicating that the stored data matching the search key is found.

Figure 6:
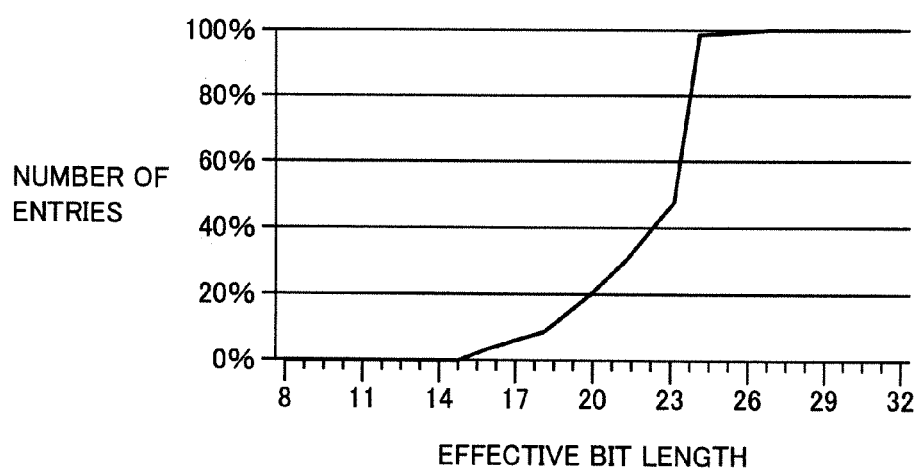
FIG. 6 is a diagram showing the relation between the effective bit length and the number of entries in a normal case in an IP address for IPv4.

FIG. 6 is a diagram showing the relation between the effective bit length and the number of entries in a usual case in the IP address for IPv4. As shown in FIG. 6, it is found that each of the effective bit lengths of most of the IP addresses recorded in the search table of the router is 24 bits or less. Accordingly, only few data words need to be recorded in small-capacity TCAM 10 in FIG. 5. Furthermore, the bit number of each data word stored in each of power-saving search engines 11A and 11B is suppressed to be 23. Therefore, according to the first embodiment, it becomes possible to perform a search at a high speed with low power consumption, and also possible to implement a search system with a relatively small memory capacity.

Figure 7:
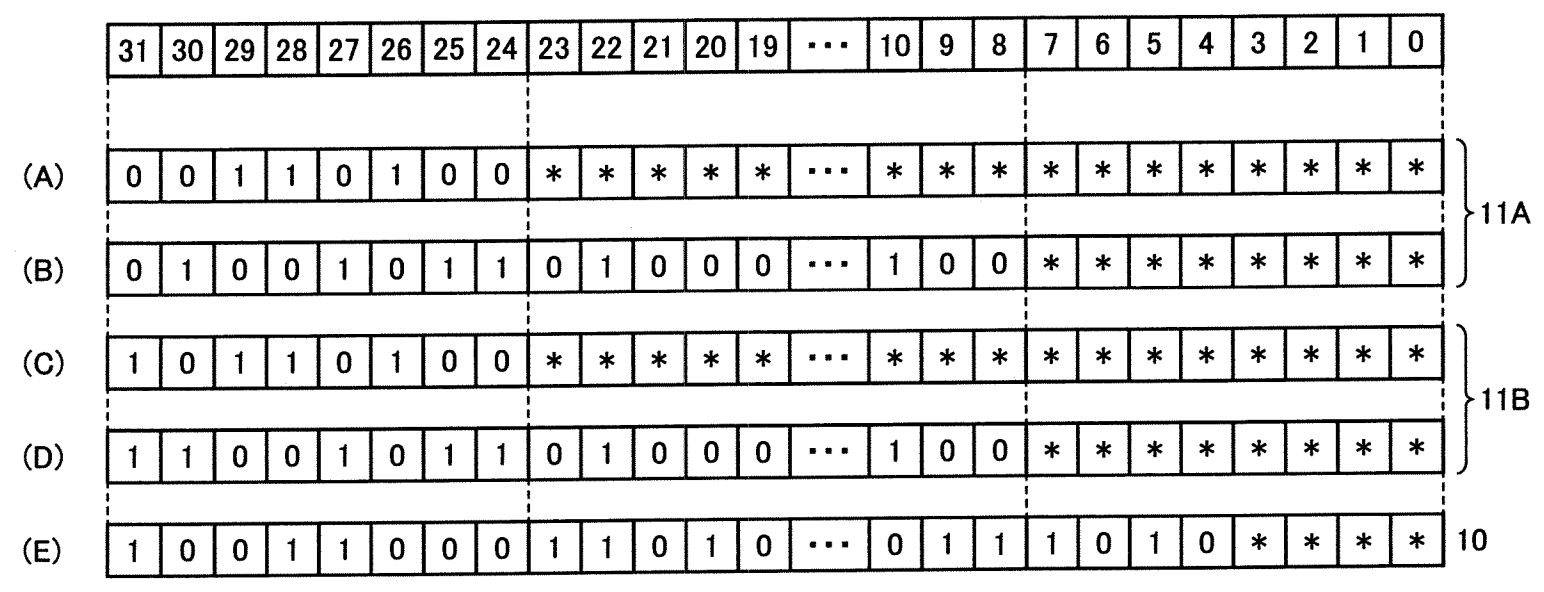

FIG. 7 is a diagram for illustrating allocation of data in the search system in FIG. 5.

In the data word shown in each of FIGS. 7(A) and 7(B), bit_31 (the most significant bit) is "0" and bit_7 to bit_0 each are a don't care bit (*). Accordingly, the bit string of bit_30 to bit_8 excluding these specific bits are stored in power-saving search engine 11A in FIG. 5.

In the data word shown in each of FIGS. 7(C) and 7(D), bit_31 (the most significant bit) is "1", and bit_7 to bit_0 each are a don't care bit (*). Accordingly, the bit string of bit_30 to bit_8 excluding these specific bits are stored in power-saving search engine 11B in FIG. 5.

The data word shown in FIG. 7(E) has an effective bit length of 28 bits, which exceeds 24 bits. Accordingly, all bits of this data word are stored in small-capacity TCAM 10.

Second Embodiment

Figure 8:
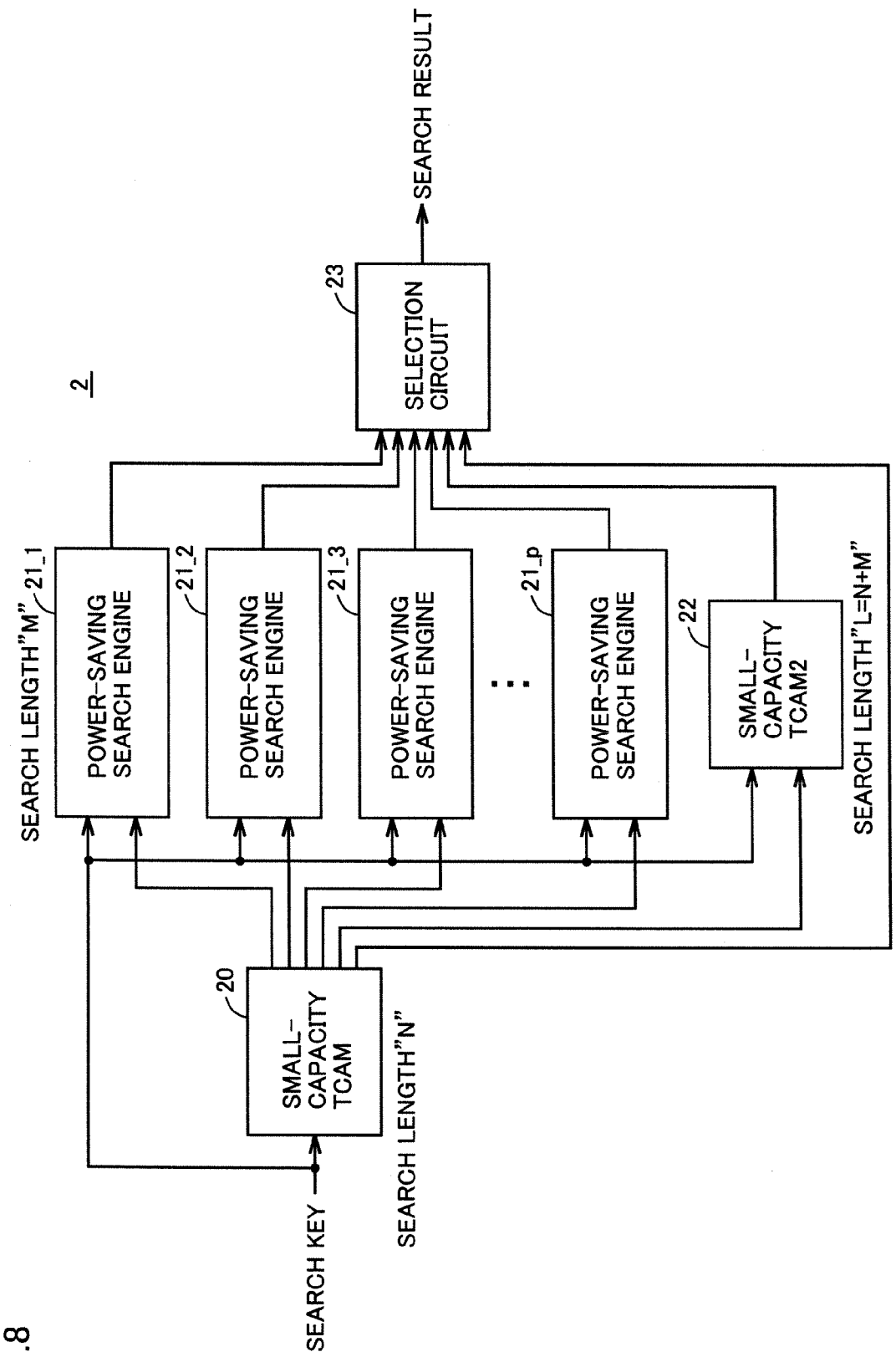
FIG. 8 is a block diagram showing the configuration of a search system according to the second embodiment.

FIG. 8 is a block diagram showing the configuration of a search system according to the second embodiment. A search system 2 in the second embodiment can record a plurality of data words each having a bit length L, and searches for the data word that matches the input search key having a bit length L. In this case, each of one or more bits continuous from the least significant bit of each data word can be set as a don't care bit.

In search system 2, the data word of bit length L is divided into N specific bits and M (M=L−N) non-specific bits (M is desirably 23 or less). In this case, if a portion of N specific bits in each data word can be classified into relatively few patterns (for example, approximately 10 or less), the search system can be constructed such that the bit string formed of N specific bits is pre-searched by a small-capacity TCAM, and the bit string formed of remaining non-specific bits is searched by a plurality of power-saving search engines in accordance with the pre-search result. A specific explanation will be hereinafter given with reference to the accompanying drawings.

Referring to FIG. 8, search system 2 includes a small-capacity TCAM (third search unit) 20 capable of storing data of a bit length N; a plurality of (p) power-saving search engines (first search units) 21_1 to 21_p capable of storing data of a bit length M; a small-capacity TCAM (second search unit) 22 capable of storing data of a bit length L (L=N+M); and a selection circuit 23.

Small-capacity TCAM 20 searches for the stored data that matches the bit string formed of N specific bits in the search key having a bit length L. The search result of small-capacity TCAM 20 is output to power-saving search engines 21_1 to 21_p, a small-capacity TCAM 22 and a selection circuit 23.

Power-saving search engines 21_1 to 21_p are provided corresponding respectively to a plurality of pieces of data stored in small-capacity TCAM 20. Each of one or more bits continuous from the least significant bit among M-bit data stored in each power-saving search engine 21 can be set as a don't care bit. Each power-saving search engine 21 searches for the data having the longest effective bit length among the stored data matching the non-specific bit string of a bit length M included in the search key. The search result of each power-saving search engine 21 is output to selection circuit 23.

Small-capacity TCAM 22 is provided for storing exceptional data words overflowing from the search table formed by small-capacity TCAM 20 and power-saving search engines 21_1 to 21_p. Usually, the data string having a bit length N formed of specific bits among the data of bit length L stored in small-capacity TCAM 22 does not match any of the stored data in small-capacity TCAM 20. Each of one or more bits continuous from the least significant bit among L-bit data stored in small-capacity TCAM 22 can be set as a don't care bit. Small-capacity TCAM 22 searches for the data having the longest effective bit length among the stored data matching the search key.

Based on the search results from small-capacity TCAM 20, power-saving search engines 21_1 to 21_p and small-capacity TCAM 22, selection circuit 23 selects one of these search results. Specifically, when the stored data matching the search key is found in small-capacity TCAM 22, selection circuit 23 outputs the address corresponding to this stored data. When the stored data matching the specific bit string of the search key is found in small-capacity TCAM 20 and the stored data matching the non-specific bit string of the search key is found in two or more of power-saving search engines 21_1 to 21_p, selection circuit 23 selects the search result of the power-saving search engine corresponding to the stored data found in small-capacity TCAM 20.

Figure 9:
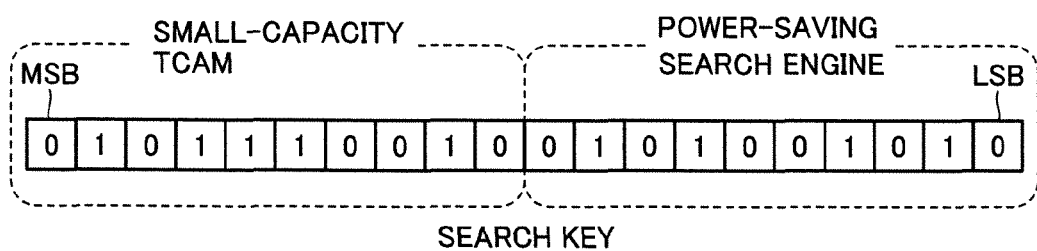
FIG. 9 is a diagram for illustrating an example of specific bits allocated to a small-capacity TCAM for a pre-search in FIG. 8.

FIG. 9 is a diagram for illustrating an example of specific bits allocated to a small-capacity TCAM for a pre-search in FIG. 8. In FIG. 9, the bit length of the search key is 20 bits. Among them, 10 bits on the most significant bit (MSB) side are allocated as specific bits to small-capacity TCAM 20 in FIG. 8 while 10 bits on the least significant bit (LSB) side are allocated as non-specific bits to power-saving search engines 21_1 to 21_p in FIG. 8. The number of pieces of data stored in small-capacity TCAM 20 and having a bit length of 10 bits should be small.

Figure 10:
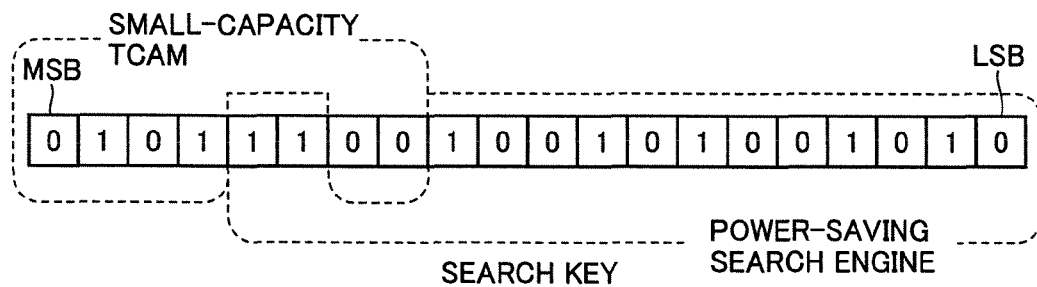
FIG. 10 is a diagram for illustrating another example of specific bits allocated to the small-capacity TCAM for a pre-search in FIG. 8.

FIG. 10 is a diagram for illustrating another example of specific bits allocated to the small-capacity TCAM for a pre-search in FIG. 8. In FIG. 10, the bit length of the search key is 20 bits. When the most significant bit is set at bit_19 and the least significant bit is set at bit_0, bit_19, bit_18, bit_17, bit_16, bit_13, and bit_12 are allocated as specific bits to small-capacity TCAM 20 in FIG. 8. In this way, specific bits may be discontinuous.

Figure 11:
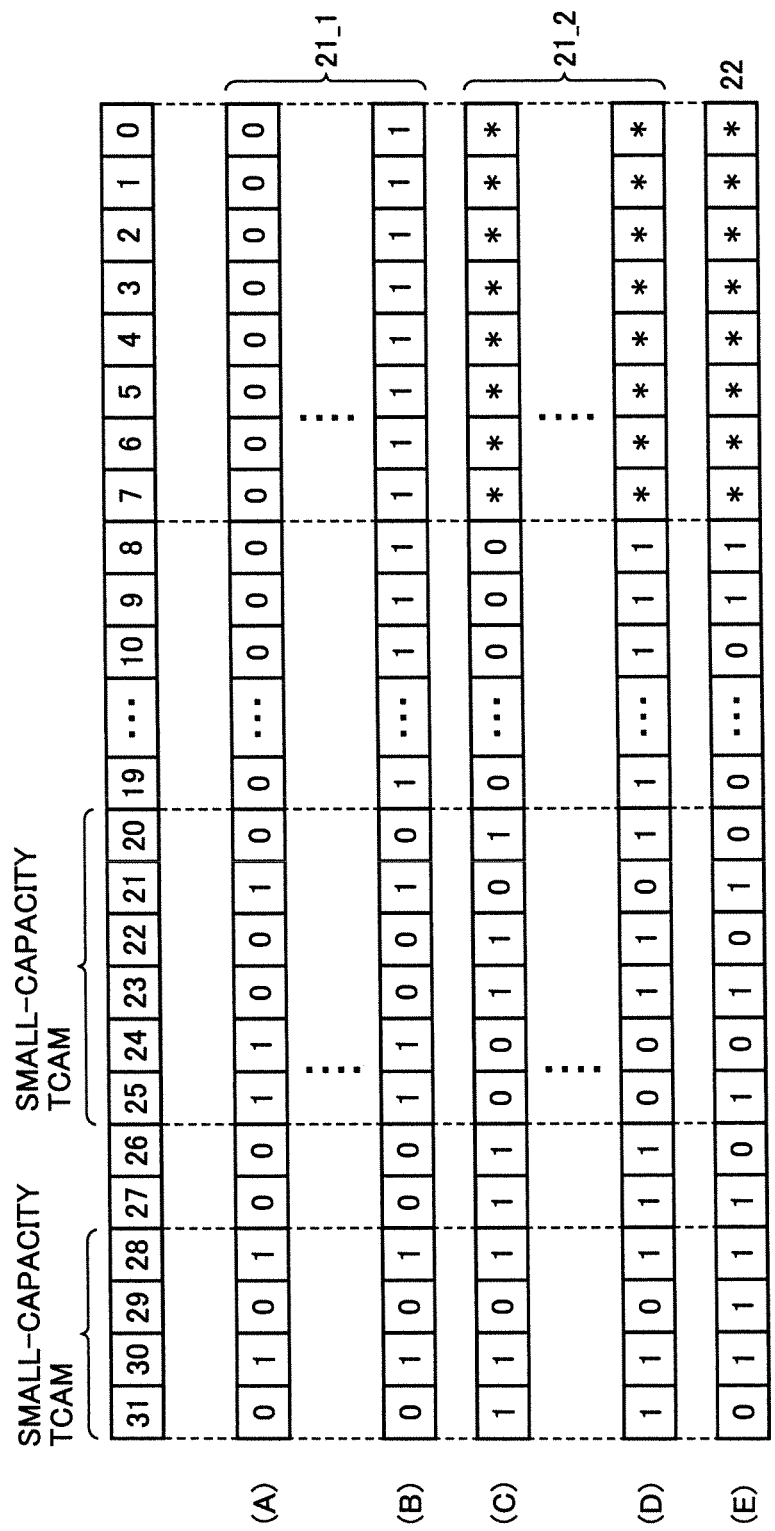
FIG. 11 is a diagram for illustrating creation of a search table for searching for an IP address of IPv4.

FIG. 11 is a diagram for illustrating creation of a search table for searching for an IP address of IPv4. In the example in FIG. 11, specific bits allocated to small-capacity TCAM 20 in FIG. 8 for pre-search are 10 bits including bit_20 to bit_25 and bit_28 to bit_31. Remaining 22 bits (bit_0 to bit_19, bit_26 and bit_27) are allocated to power-saving search engine 21 as non-specific bits.

Specifically, since the data words shown in FIGS. 11(A) and 11(B) have identical specific bit values, these data words are allocated to a common power-saving search engine 21_1. Each data word having a value of bit string between the value of bit string of the data word shown in FIG. 11(A) and the value of bit string of the data word shown in FIG. 11(B) (data words having different values of bit_0 to bit_19) can also be allocated to the same power-saving search engine 21_1.

Similarly, since the data words shown in FIGS. 11(C) and 11(D) have identical specific bit values, these data words are allocated to a common power-saving search engine 21_2. Each data word having a value of bit string between the value of bit string of the data word shown in FIG. 11(C) and the value of bit string of the data word shown in FIG. 11(D) (data words having different values of bit_0 to bit_19) can also be allocated to the same power-saving search engine 21_2.

The data word shown in FIG. 11(E) is different in specific bit value from the data words shown in FIGS. 11(A) to (D), which also shows an example in the case where the number of types of bit strings formed of non-specific bits is relatively few. In this way, when there are few data words having common higher-order bits among the data words to be recorded in the search table, it is desirable that such data words are allocated to small-capacity TCAM 22.

Figure 12:
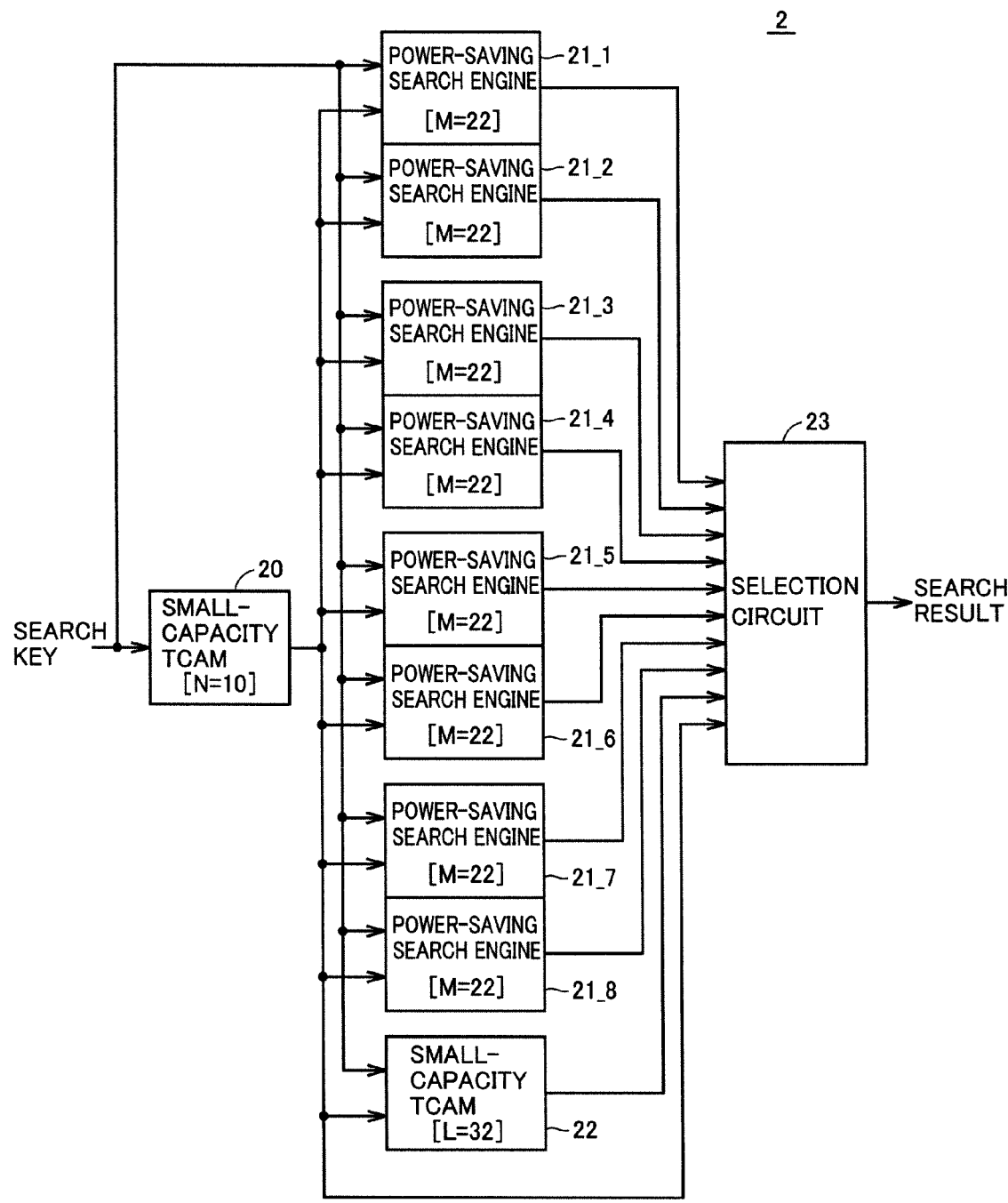
FIG. 12 is a diagram showing an example of a search system appropriate for FIG. 11.

FIG. 12 is a diagram showing an example of a search system appropriate for data words in FIG. 11. Referring to FIG. 12, the number of types of data (bit length N=10) stored in small-capacity TCAM 20 is assumed to be eight. In this case, eight power-saving search engines 21_1 to 21_8 each capable of storing data having a bit length M=22 are provided corresponding respectively to the eight types of stored data in small-capacity TCAM 20.

It is noted that the power-saving search engine having a bit length M=23 can be used also as two power-saving search engines each having a bit length M=22, also used as four power-saving search engines each having a bit length M=21, or used as eight power-saving search engines each having a bit length M=20. Accordingly, it is not necessary to prepare search engines having different bit lengths in accordance with the bit number of non-specific bits.

For example, the power-saving search engine having M=4 shown in FIG. 4 is divided into a portion where the address's most significant bit is 0 and a portion where the address's most significant bit is 1, it can be used as two power-saving search engines each having M=3. In this case, address generation unit 202 generates an address for searching memory spaces P2 to P4 based on a virtual 4-bit search key obtained by adding 0 or 1 as most significant bits (headers) to an actual 3-bit search key. Memory spaces P1 and P0 are not used.

In the case of FIG. 12, four power-saving search engines each having a bit length M=23 are used as eight power-saving search engines each having a bit length M=22. For example, one power-saving search engine having a bit length M=23 is formed by power-saving search engines 21_1 and 21_2.

As described above, also in the second embodiment, a search can be carried out with low power consumption and at a high speed, and further, a search system having a relatively small memory capacity can be implemented.

Third Embodiment

Configuration of Power-Saving Search Engine
200A

Figure 13:
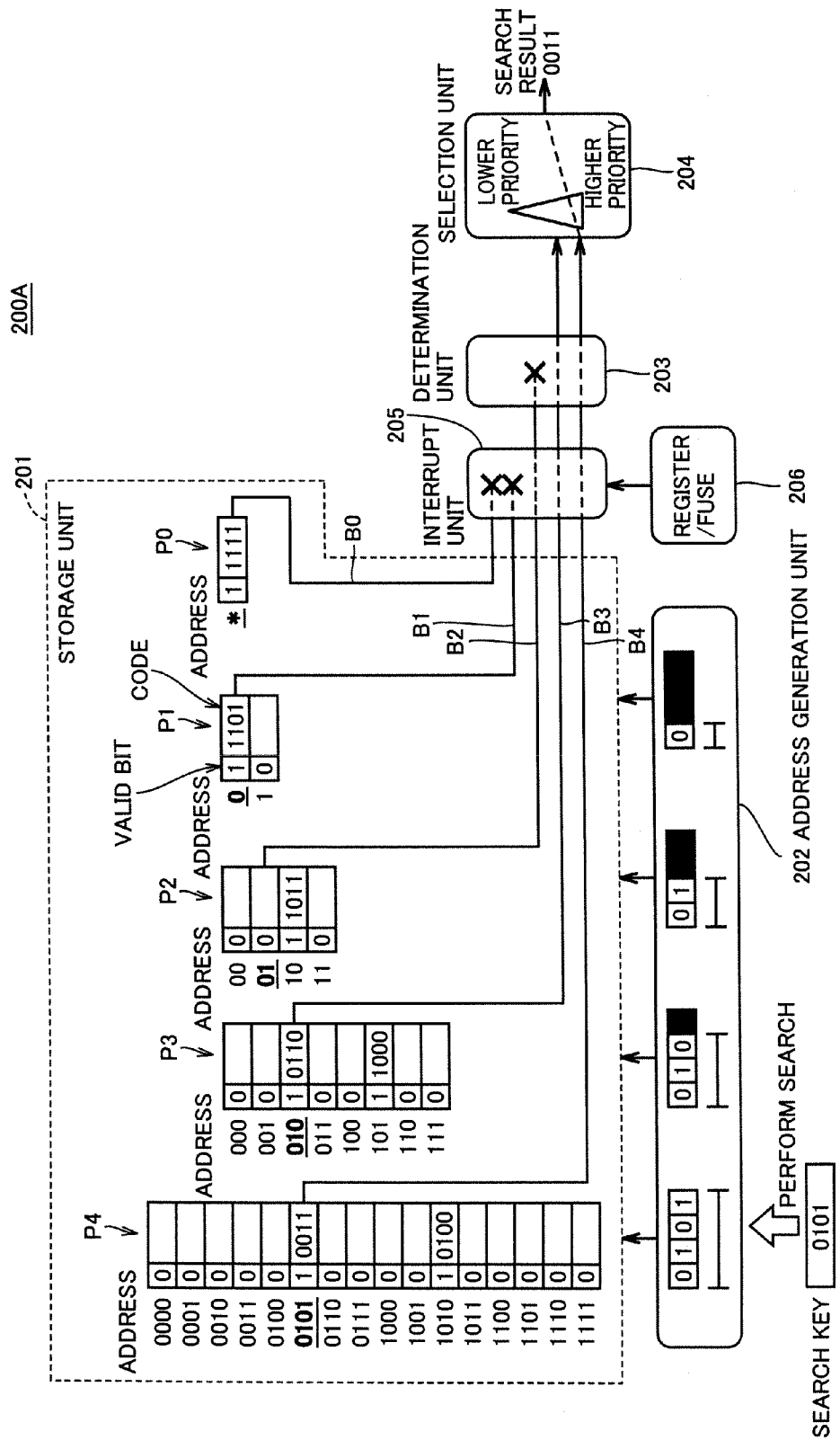
FIG. 13 is a block diagram showing the configuration of a power-saving search engine used in a search system according to the third embodiment.

FIG. 13 is a block diagram showing the configuration of a power-saving search engine 200A used in a search system according to the third embodiment.

Although the entire configuration of the search system according to the third embodiment is the same as those in the first and second embodiments, the power-saving search engine is different in configuration from power-saving search engine 200 illustrated in FIG. 4. Specifically, power-saving search engine 200A in FIG. 13 is different from power-saving search engine 200 in FIG. 4 in that it further includes an interrupt unit 205. As will be described later in FIGS. 14 and 15, interrupt unit 205 is provided for invalidating the read data from an unused memory space when only part of memory spaces P1 to P4 and memory P0 forming storage unit 201 is used.

Referring to FIG. 13, interrupt unit 205 interrupts transfer of the read data that is not to be determined by determination unit 203 among M+1 pieces of read data read from M (M=4) memory spaces P1 to P4 and memory P0. Consequently, only the read data that is to be determined by determination unit 203 is transferred from storage unit 201 to determination unit 203. Then, determination unit 203 determines whether or not the transferred read data is valid read data including a prescribed code (that is, whether the valid bit is "1" or not).

In this case, a register or a fuse 206 may be provided within the search system. This register or fuse 206 can set in advance as to which one of pieces of the read data read from memory spaces P1 to P4 and memory P0 is interrupted from being transferred to determination unit 203.

Specifically in the case of FIG. 13, interrupt unit 205 interrupts transfer of the read data read from memory space P1 and memory P0. For the read data read from memory spaces P2 to P4 that are not interrupted by interrupt unit 205, determination unit 203 determines whether the valid bit is valid or not. Consequently, determination unit 203 determines that data [1/0011] read from memory space P4 and data [1/0110] read from memory space P3 are valid, and determines that data [0/–] read from memory space P2 is invalid. Selection unit 204 outputs a code [0011] included in the data read from memory space P4 of the highest priority among the read data determined as valid by determination unit 203.

[Usage Example 1 of Power-Saving Search Engine 200A]

Figure 14:
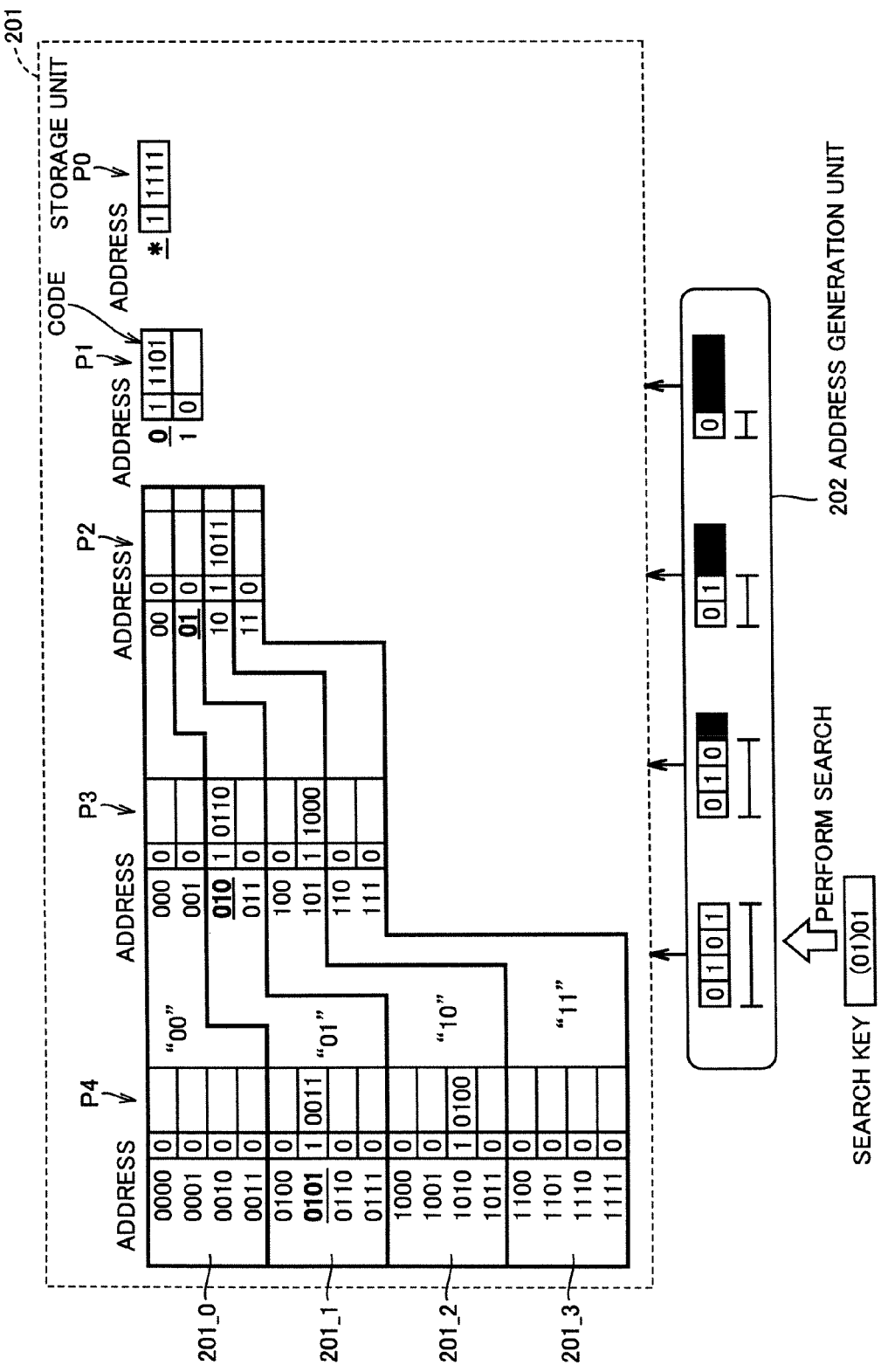
FIG. 14 is a diagram for illustrating a usage example of the power-saving search engine in FIG. 13.

FIG. 14 is a diagram for illustrating a usage example of a power-saving search engine 200A in FIG. 13. FIG. 14 shows an example in which power-saving search engine 200A appropriate for a 4-bit search key is used as four power-saving search engines appropriate for a 2-bit search key. In this case, storage unit 201 is divided into four storage units (search tables) 201_0, 201_1, 201_2, and 201_3. It is distinguished by a 2-bit header added to a search key as to which one of storage units 201_0 to 201_3 is set as a search target. In the case of FIG. 14, storage units 201_0, 201_1, 2012, and 201_3 are distinguished by headers "00", "01", "10", and "11", respectively.

For example, when a search is carried out using a 2-bit search key "01" in the state where storage unit 201_1 is set as a search target, address generation unit 202 receives an input of a 4-bit search key "0101" obtained by adding a header "01" to a search key "01". Address generation unit 202 generates a read address [0101] for memory space P4, a read address [010] for memory space P3, a read address [01] for memory space P2, and a read address [0] for memory space P1. The stored data in the region identified by the corresponding read address is read from each of memory spaces P1 to P4. It is to be noted that the read data from each of memory spaces P1 and P0 is not used as search results.

Similarly, when a search is carried out using a 2-bit search key "01" in the state where storage unit 2012 is set as a search target, address generation unit 202 receives an input of a 4-bit search key "1001" obtained by adding a header "10" to a search key "01". Address generation unit 202 generates a read address [1001] for memory space P4, a read address [100] for memory space P3, a read address [10] for memory space P2, and a read address [1] for memory space P1. The stored data in the region identified by the corresponding read address is read from each of memory spaces P1 to P4.

In each of the above examples, the read data from each of memory space P1 and memory P0 is not used as a search result. Accordingly, interrupt unit 205 described with reference to FIG. 13 is provided. Since the read data from each of memory space P1 and memory P0 is interrupted by interrupt unit 205, each read data is not transferred to determination unit 203 and not regarded as a target to be determined by determination unit 203.

Assuming that interrupt unit 205 is not provided, the stored data in memory space P1 and memory P0 may be a search result of the entire power-saving search engine 200A when the search of each of memory spaces P2 to P4 results in a miss. In this case, if a defect occurs in memory space P1 and memory P0 that are not used for an actual search, the entire power-saving search engine is to end up a defective product even though these memories P1 and P0 are not used. By providing interrupt unit 205 in FIG. 13, such a disadvantage can be avoided and the yield of the product can be raised.

[Usage Example 2 of Power-Saving Search Engine 200A]

Figure 15:
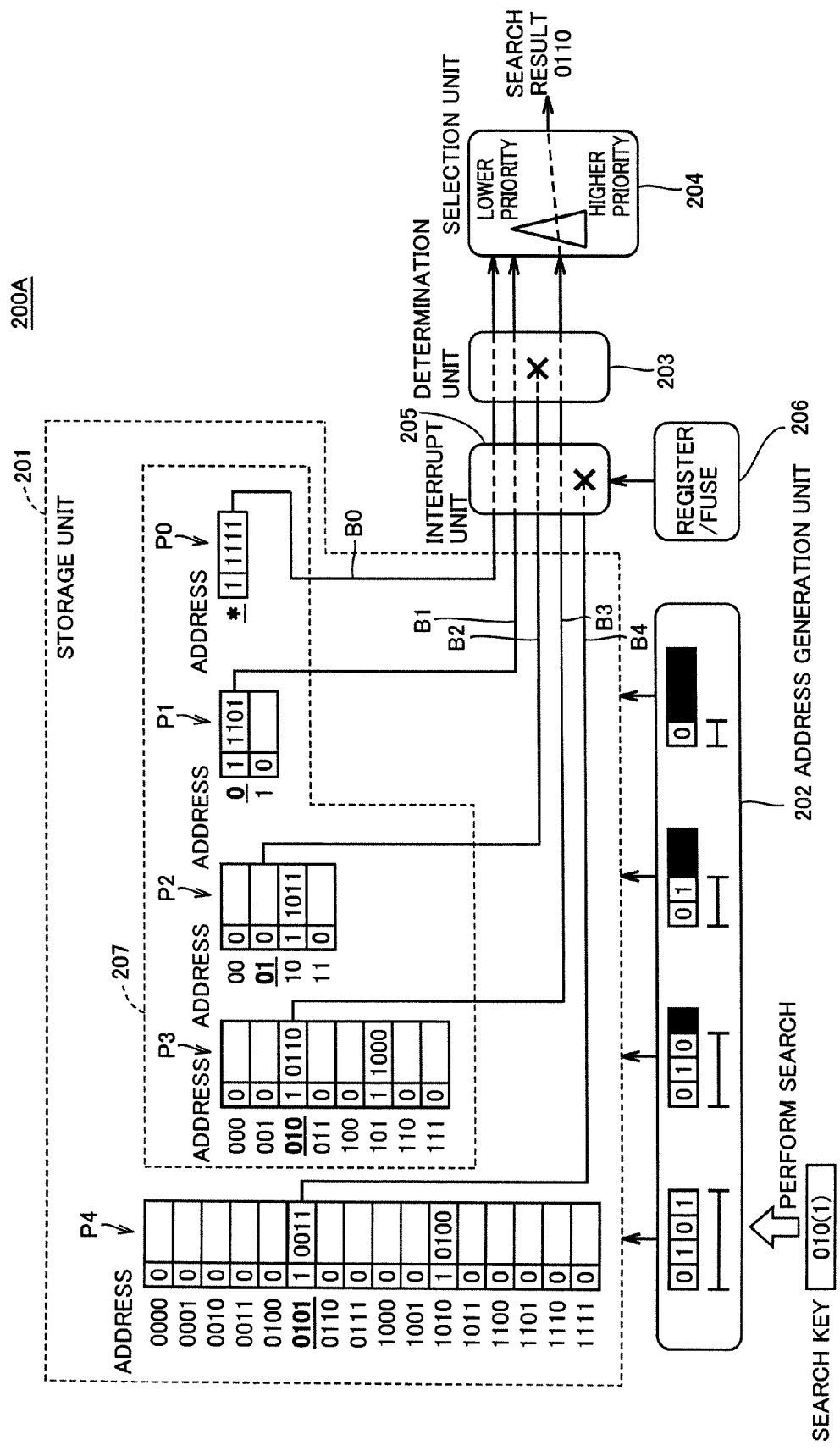
FIG. 15 is a diagram for illustrating another usage example of the power-saving search engine in FIG. 13.

FIG. 15 is a diagram for illustrating another usage example of power-saving search engine 200A in FIG. 13. FIG. 15 shows an example in which power-saving search engine 200A appropriate for a 4-bit search key is used as one power-saving search engine appropriated for a 3-bit search key. In this case, memory spaces P3 to P1 and memory P0 are used as a storage unit 207 (a search table) for a power-saving search engine appropriate for a 3-bit search key, but memory space P4 is not used.

For example, when a search is carried out using a 3-bit search key "010", address generation unit 202 receives an input of a search key "0100" (or "0101") obtained by adding a 1-bit footer (the footer may be "0" or "1") to a search key "010". Address generation unit 202 generates a read address [0100] for memory space P4, a read address [010] for memory space P3, a read address [01] for memory space P2, and a read address [0] for memory space P1. From each of memory spaces P1 to P4, the stored data in the region identified by the corresponding read address is read. Since the read data from memory space P4 not used for a search is interrupted by interrupt unit 205, this read data is not transferred to determination unit 203. Determination unit 203 determines whether the read data from each of memory P0 and memory spaces P1 to P3 is valid or not. Selection unit 204 outputs a code "0110", as a search result, stored in memory space P3 of the highest priority among the read data determined as valid by determination unit 203.

Power-saving search engine 200A appropriate for a 4-bit search key can also be used as two power-saving search engines appropriate for a 3-bit search key. In this case, memory spaces P1 to P4 are divided into two storage units (search tables). The first storage unit is formed by storage units 201_0, 201_1 and an address "0" region in memory space P1 in FIG. 14 (the corresponding header is "0"). The second storage unit is formed by storage units 201_2, 201_3 and an address "1" region in memory space P1 in FIG. 14 (the corresponding header is "1"). Memory P0 is not used. Address generation unit 202 receives an input of a 4-bit search key obtained by adding a header ("0" or "1"), which is appropriate for the storage unit to be used, to a 3-bit search key.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A search system comprising:
a plurality of first search units each configured to store a plurality of pieces of data of a bit length M, and search, in a first search scheme, for stored data matching a non-specific bit string of a bit length M, wherein said non-specific bit string is obtained by excluding N (N=L−M) specific bits defined in advance from a search key of a bit length L (L>M) that has been input;
a second search unit configured to store a plurality of pieces of data of a bit length L, and search for stored data matching said search key in a second search scheme different from said first search scheme; and
a selection circuit configured to, based on search results from said plurality of first search units and said second search unit, select one of said search results.

2. The search system according to claim 1, wherein said plurality of first search units and said second search unit each are configured to:
be capable of storing data including one don't care bit of a least significant bit or a plurality of don't care bits continuous from the least significant bit; and
output information corresponding to the stored data having a longest effective bit length as a search result among the stored data found by search.

3. The search system according to claim 2, further comprising a third search unit configured to store a plurality of pieces of data of a bit length N, and search for stored data matching a bit string consisting of said N specific bits in said search key in said second search scheme, wherein
said plurality of first search units correspond to a plurality of pieces of data stored in said third search unit, respectively, and
when selecting one of a plurality of search results output from said plurality of first search units, said selection circuit selects the search result of the first search unit corresponding to the stored data searched by said third search unit.

4. The search system according to claim 3, wherein
said second search unit and said third search unit each include a TCAM (Ternary Content Addressable Memory), and
each of said plurality of first search units does not include a TCAM.

5. The search system according to claim 4, wherein
each of said first search units includes a storage unit having M memory spaces,
an address of a bit number i is allocated to an i-th (1≤i≤M) memory space,
the greater an address size is, the higher the memory space is prioritized,
an effective bit portion of each data stored in each of said first search units is used as an address to identify a storage region of said memory spaces,
the storage region identified by an effective bit portion of a piece of stored data stores a code corresponding to the piece of stored data, and
each of said first search units further includes:
an address generation unit extracting continuous j (1≤j≤M) bits from a most significant bit of the non-specific bit string of said bit length M, thereby generating M read addresses corresponding to said M memory spaces, respectively;
a determination unit determining whether or not read data read from each of said M memory spaces by said M read addresses is valid read data including said code; and
a selection unit selecting a code included in the read data read from the memory space of the highest priority from among the read data determined as valid by said determination unit, and outputting said selected code.

6. The search system according to claim 5, wherein
one or more pieces of read data among M pieces of read data read respectively from said M memory spaces excluding one or more pieces of read data defined in advance can be set as a target to be determined by said determination unit, and
said determination unit determines whether the one or more pieces of read data set as a target to be determined is valid or not.

7. The search system according to claim 4, wherein
each of said first search units includes a storage unit having M memory spaces and a register,
an address of a bit number i is allocated to an i-th (1≤i≤M) memory space,
the greater an address size is, the higher the memory space is prioritized,
an effective bit portion of each data stored in each of said first search units is used as an address to identify a storage region of said memory spaces,
the storage region identified by an effective bit portion of a piece of stored data stores a code corresponding to the piece of stored data,
said resister stores a code to be output when none of the stored data matches the non-specific bit string of said bit length M,
said register is lower in priority than said M memory spaces, and
each of said first search units further includes:
an address generation unit extracting continuous j (1≤j≤M) bits from a most significant bit of the non-specific bit string of said bit length M, thereby generating M read addresses corresponding to said M memory spaces, respectively;
a determination unit determining whether or not read data read from each of said M memory spaces by said M read addresses and read data read from said register each are valid read data including said code; and
a selection unit selecting a code included in the read data read from the memory space of the highest priority or said register from among the read data determined as valid by said determination unit, and outputting said selected code.

8. The search system according to claim 7, wherein
one of more pieces of read data among M pieces of read data read respectively from said M memory spaces and read data read from said register excluding one or more pieces of read data defined in advance can be set as a target to be determined by said determination unit, and
said determination unit determines whether the one or more pieces of read data set as a target to be determined is valid or not.

9. The search system according to claim 2, wherein
said second search unit includes a TCAM (Ternary Content Addressable Memory), and
each of said plurality of first search units does not include a TCAM.

10. The search system according to claim 9, wherein
each of said first search units includes a storage unit having M memory spaces,
an address of a bit number i is allocated to an i-th (1≤i≤M) memory space, the greater an address size is, the higher the memory space is prioritized, an effective bit portion of each data stored in each of said first search units is used as an address to identify a storage region of said memory spaces, the storage region identified by an effective bit portion of a piece of stored data stores a code corresponding to the piece of stored data, and each of said first search units further includes:

an address generation unit extracting continuous j ($1 \leq j \leq M$) bits from a most significant bit of the non-specific bit string of said bit length M, thereby generating M read addresses corresponding to said M memory spaces, respectively;

a determination unit determining whether or not read data read from each of said M memory spaces by said M read addresses is valid read data including said code; and a selection unit selecting a code included in the read data read from the memory space of the highest priority from among the read data determined as valid by said determination unit, and outputting said selected code.

11. The search system according to claim 10, wherein one or more pieces of read data among M pieces of read data read respectively from said M memory spaces excluding one or more pieces of read data defined in advance can be set as a target to be determined by said determination unit, and said determination unit determines whether the one or more pieces of read data set as a target to be determined is valid or not.

12. The search system according to claim 9, wherein each of said first search units includes a storage unit having M memory spaces and a register, an address of a bit number i is allocated to an i-th ($1 \leq i \leq M$) memory space, the greater an address size is, the higher the memory space is prioritized, an effective bit portion of each data stored in each of said first search units is used as an address to identify a storage region of said memory spaces, the storage region identified by an effective bit portion of a piece of stored data stores a code corresponding to the piece of stored data, said resister stores a code to be output when none of the stored data matches the non-specific bit string of said bit length M, said register is lower in priority than said M memory spaces, and each of said first search units further includes an address generation unit extracting continuous j ($1 \leq j \leq M$) bits from a most significant bit of the non-specific bit string of said bit length M, thereby generating M read addresses corresponding to said M memory spaces, respectively, a determination unit determining whether or not read data read from each of said M memory spaces by said M read addresses and read data read from said register each are valid read data including said code, and a selection unit selecting a code included in the read data read from the memory space of the highest priority or said register from among the read data determined as valid by said determination unit, and outputting said selected code.

13. The search system according to claim 12, wherein one or more pieces of read data among M pieces of read data read respectively from said M memory spaces and read data read from said register excluding one or more pieces of read data defined in advance can be set as a target to be determined by said determination unit, and said determination unit determines whether the one or more pieces of read data set as a target to be determined is valid or not.

* * * * *